US012588255B2

(12) United States Patent
Lee et al.

(10) Patent No.: US 12,588,255 B2
(45) Date of Patent: Mar. 24, 2026

(54) SEMICONDUCTOR DEVICE AND METHODS FOR FORMING THE SAME

(71) Applicant: Vanguard International Semiconductor Corporation, Hsinchu (TW)

(72) Inventors: Wen-Shan Lee, Hsinchu City (TW); Chung-Yeh Lee, Xinpu Township (TW); Fu-Hsin Chen, Zhudong Township (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 572 days.

(21) Appl. No.: 18/059,022

(22) Filed: Nov. 28, 2022

(65) Prior Publication Data

US 2024/0178270 A1     May 30, 2024

(51) Int. Cl.
| | |
|---|---|
| *H10D 62/10* | (2025.01) |
| *H10D 30/01* | (2025.01) |
| *H10D 30/63* | (2025.01) |
| *H10D 30/66* | (2025.01) |
| *H10D 64/01* | (2025.01) |
| *H10D 64/27* | (2025.01) |
| *H10P 30/22* | (2026.01) |

(52) U.S. Cl.
CPC ......... *H10D 62/111* (2025.01); *H10D 30/025* (2025.01); *H10D 30/63* (2025.01); *H10D 30/668* (2025.01); *H10D 64/01* (2025.01); *H10D 64/513* (2025.01); *H10P 30/22* (2026.01)

(58) Field of Classification Search
CPC .... H10D 62/111; H10D 30/63; H10D 30/668; H10D 64/513
See application file for complete search history.

(56) References Cited

U.S. PATENT DOCUMENTS

| | | | |
|---|---|---|---|
| 6,566,201 B1 * | 5/2003 | Blanchard | H10D 30/0291 257/E29.066 |
| 6,803,626 B2 * | 10/2004 | Sapp | H10D 64/117 257/341 |
| 7,470,953 B2 | 12/2008 | Takaya et al. | |

(Continued)

FOREIGN PATENT DOCUMENTS

| | | |
|---|---|---|
| CN | 108598166 A | 9/2018 |
| TW | 201423995 A | 6/2014 |

*Primary Examiner* — Joseph C. Nicely
(74) *Attorney, Agent, or Firm* — Birch, Stewart, Kolasch & Birch, LLP

(57) ABSTRACT

A semiconductor device includes a substrate, an epitaxial layer on the substrate, a well region in the epitaxial layer, an insulating pillar extending into the epitaxial layer, a first doping region in the epitaxial layer and surrounding the insulating pillar, a second doping region under the first doping region, and a gate structure formed at one lateral side of the insulating pillar and extending into the epitaxial layer. The substrate and the epitaxial layer each have a first conductivity type. The well region and the first and second doping regions each have a second conductivity type. The gate structure is separated from the insulating pillar. The insulating pillar penetrates the first doping region by extending from the top portion to the bottom portion of the first doping region. The first doping region is electrically connected to the well region.

20 Claims, 10 Drawing Sheets

(56)                References Cited

U.S. PATENT DOCUMENTS

| | | | | |
|---|---|---|---|---|
| 8,143,124 | B2 * | 3/2012 | Challa ............... | H01L 21/31116 257/341 |
| 9,368,587 | B2 * | 6/2016 | Kocon ................. | H10D 62/107 |
| 9,627,470 | B2 * | 4/2017 | Song ................... | H10D 62/109 |
| 9,660,073 | B1 * | 5/2017 | Lin .................... | H10D 84/0151 |
| 9,954,055 | B2 | 4/2018 | Kobayashi et al. | |
| 2002/0117715 | A1 * | 8/2002 | Oppermann ......... | H10D 62/157 257/E29.066 |
| 2008/0138953 | A1 * | 6/2008 | Challa ................ | H01L 21/6835 257/E21.546 |
| 2008/0142880 | A1 * | 6/2008 | Blanchard ........... | H10D 62/111 257/E21.419 |
| 2011/0284955 | A1 * | 11/2011 | Sapp ................... | H10D 62/111 257/334 |
| 2015/0041884 | A1 * | 2/2015 | Song ................... | H10D 62/111 257/329 |

* cited by examiner

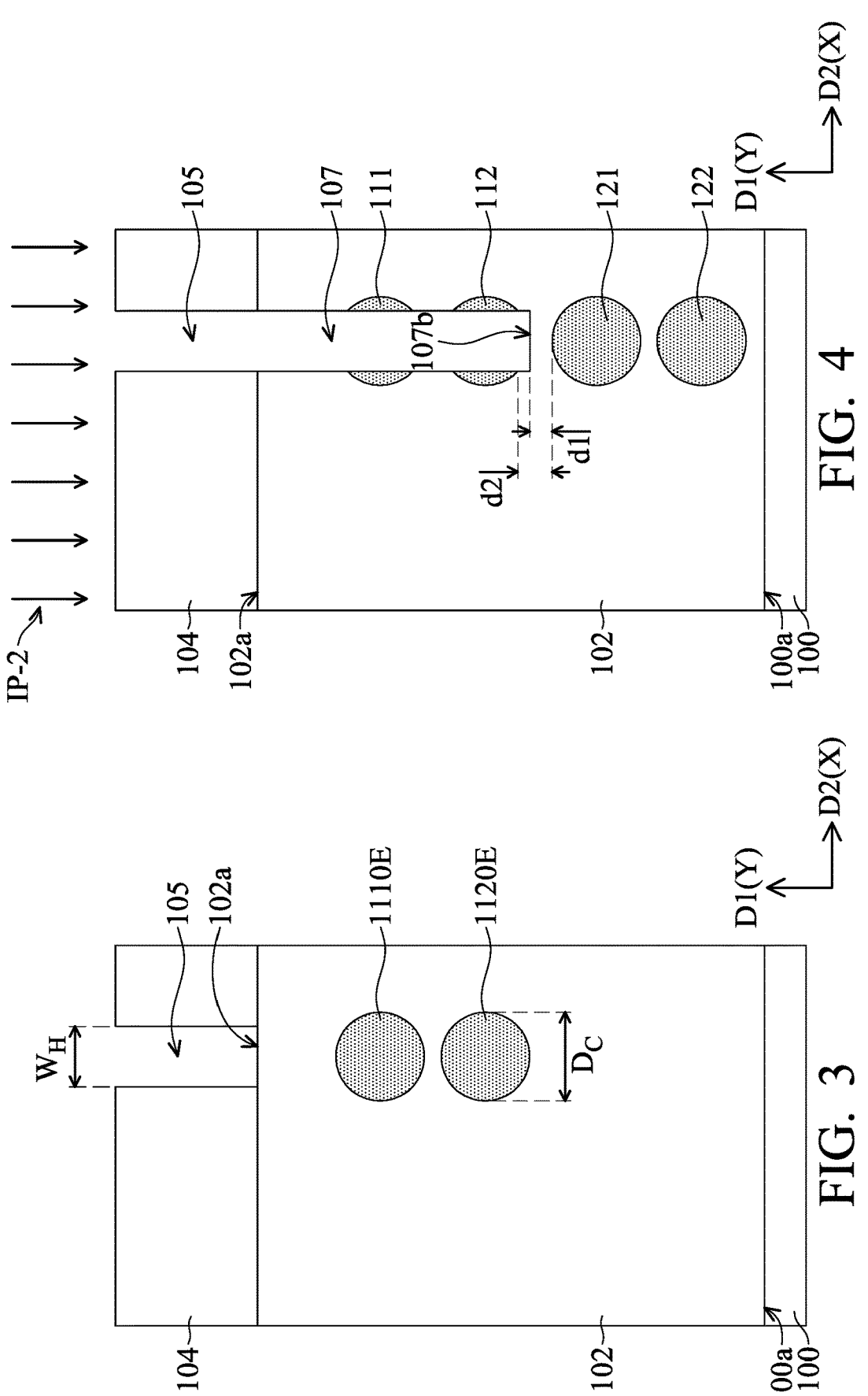

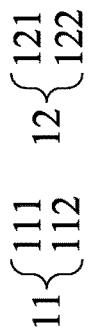
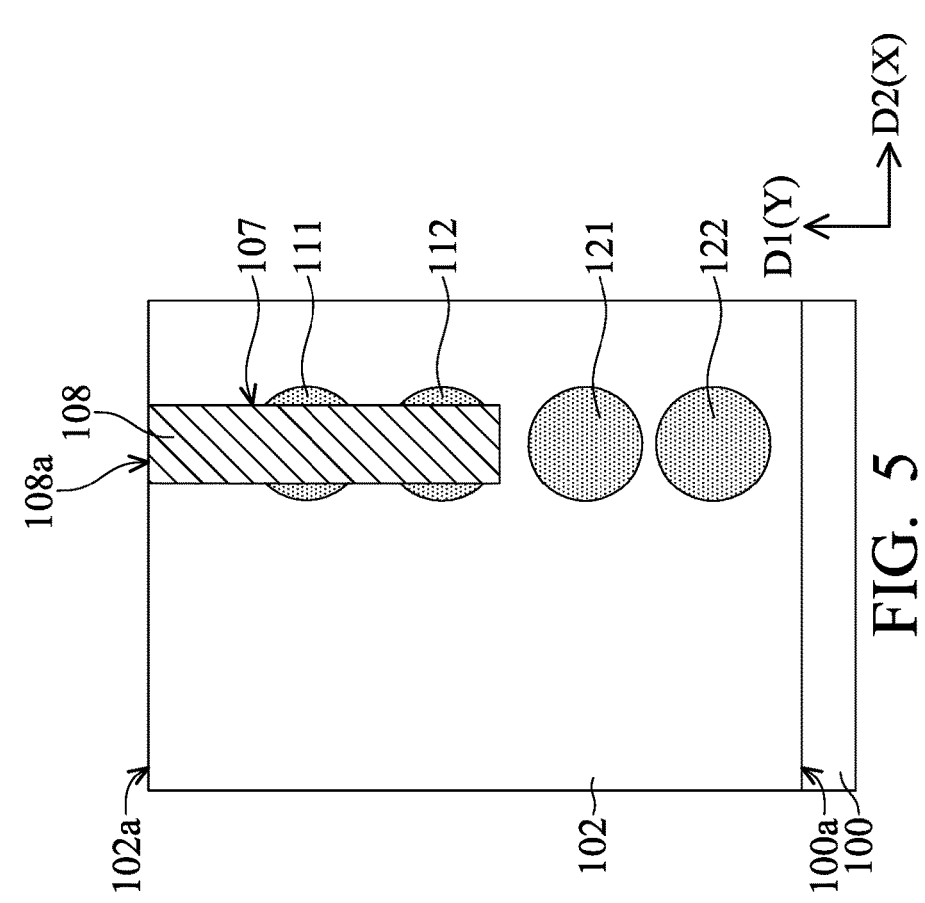
FIG. 5

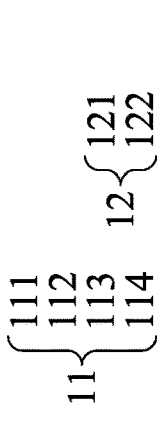
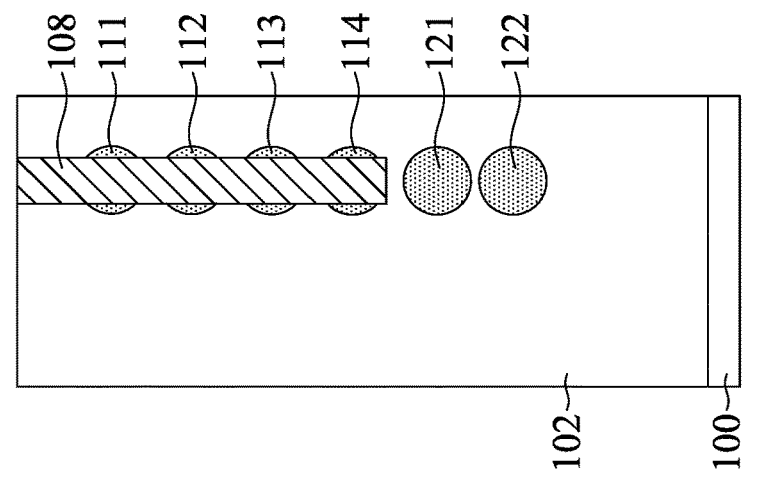
FIG. 6I
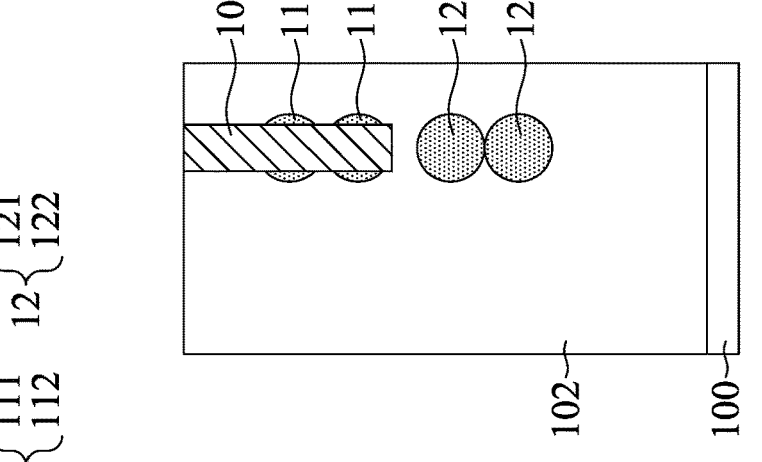
FIG. 6H
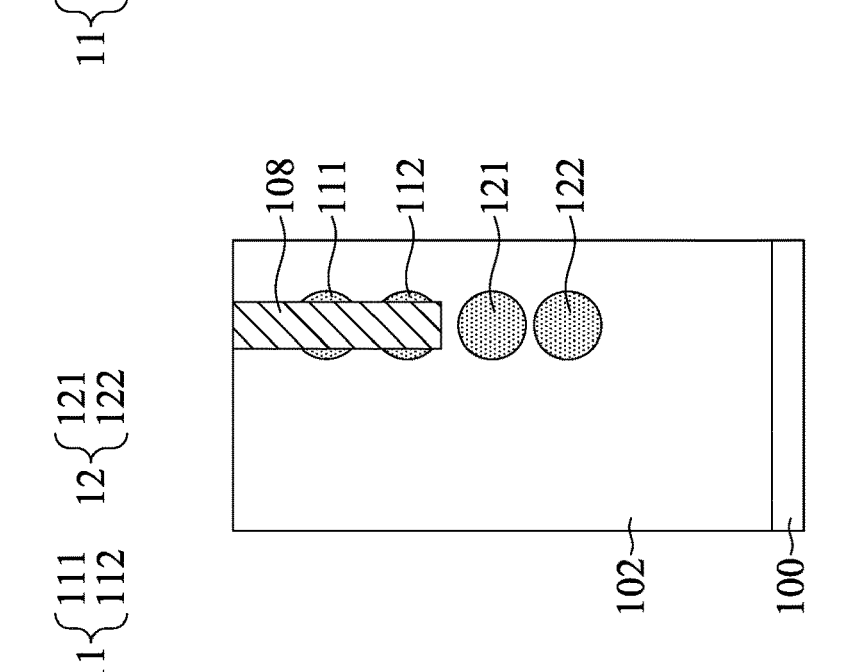
FIG. 6G

SEMICONDUCTOR DEVICE AND METHODS FOR FORMING THE SAME

BACKGROUND

Technical Field

The disclosure relates to a semiconductor device and methods for forming the same, and it relates to a semiconductor device that includes a reduced surface electric field (RESURF) structure and methods for forming the same.

Description of the Related Art

The integration density of different electronic components is being continuously improved in the semiconductor industry. Continuously decreasing the minimum size of components allows more and more components to be integrated into a given area. For example, trench gate metal-oxide-semiconductor field effect transistors, which are widely applied in power switch components, are designed to have a vertical structure to increase their functional density. In a trench gate metal-oxide-semiconductor field effect transistor (MOSFET), the back of the chip serves as a drain, while the sources and gates of various transistors are formed on the front of the chip. Accordingly, the flow of the driving current of a planar semiconductor device is in a horizontal direction, while the flow of the driving current of a trench gate semiconductor device is in a vertical direction, so that the trench gate semiconductor device can achieve a high-withstand voltage. In addition, semiconductor devices with super junction structures have recently been developed. The on-resistance of a semiconductor device that includes a vertical trench gate or a super junction structure can be decreased by increasing the doping concentration of a drift layer that is epitaxially deposited and doped.

However, the fabrication of a traditional super junction structure requires additional technology of multiple epitaxial processes and several photolithography and ion-implantation processes, which is complicated and time-consuming. Moreover, performing multiple epitaxial processes may lead to several problems such as an increase of the manufacturing cost, the formation of epitaxial defects, and the misalignment of overlay patterns that are formed by photolithography.

SUMMARY

Some embodiments of the present disclosure provide semiconductor device. A semiconductor structure includes a substrate, an epitaxial layer, a well region, an insulating pillar, at least one first doping region, at least one second doping region, and a gate structure. The substrate has a first conductivity type. The epitaxial layer is formed on the substrate and has the first conductivity type. The well region is formed in the epitaxial layer and has a second conductivity type. The insulating pillar extends into the epitaxial layer. The first doping region is formed in the epitaxial layer and has the second conductivity type. The second doping region is formed in the epitaxial layer and has the second conductivity type. The gate structure is disposed at one lateral side of the insulating pillar. The first doping region surrounds sidewalls of the insulating pillar. The insulating pillar penetrates the first doping region by extending from the top portion of the first doping region to the bottom portion of the first doping region. The first doping region is electrically connected to the well region. The second doping region is positioned under the first doping region and closer to the substrate than the first doping region. The gate structure extends into the epitaxial layer and is separated from the insulating pillar.

Some embodiments of the present disclosure provide methods for forming a semiconductor device. A method for forming a semiconductor device includes providing a substrate having a first conductivity type. The method includes forming an epitaxial layer on the substrate, wherein the epitaxial layer has the first conductivity type. The method includes providing a mask over the epitaxial layer, wherein the mask has a hole to expose the top surface of the epitaxial layer. The method includes performing a first ion implantation process over the mask to form at least one first doping region in the epitaxial layer through the hole of the mask. The first doping region has the second conductivity type. The method includes removing a portion of the epitaxial layer and a portion of the first doping region to form a trench in the epitaxial layer. The bottom surface of the trench exposes the epitaxial layer. The method includes performing a second ion implantation process over the mask to form at least one second doping region in the epitaxial layer through the hole of the mask. The method includes filling the trench with an insulating material. The method includes forming a gate structure at one lateral side of the trench. The gate structure extends into the epitaxial layer and is separated from the insulating material in the trench.

A detailed description is given in the following embodiments with reference to the accompanying drawings.

BRIEF DESCRIPTION OF THE DRAWINGS

The embodiments of the disclosure can be more fully understood by reading the subsequent detailed description and examples with references made to the accompanying drawings. For clarity of illustration, various elements in the drawings may not be drawn to scale, wherein:

FIG. 1, FIG. 2, FIG. 3, FIG. 4 and FIG. 5 illustrate cross-sectional views of intermediate stages of a method for forming a semiconductor device in accordance with some embodiments of the present disclosure.

FIG. 6A, FIG. 6B, FIG. 6C, FIG. 6D, FIG. 6E, FIG. 6F, FIG. 6G, FIG. 6H and FIG. 6I illustrate cross-sectional views of the configurations of doping regions in various RESURF structures in accordance with some embodiments of the present disclosure.

DETAILED DESCRIPTION

Figures 1, 2:
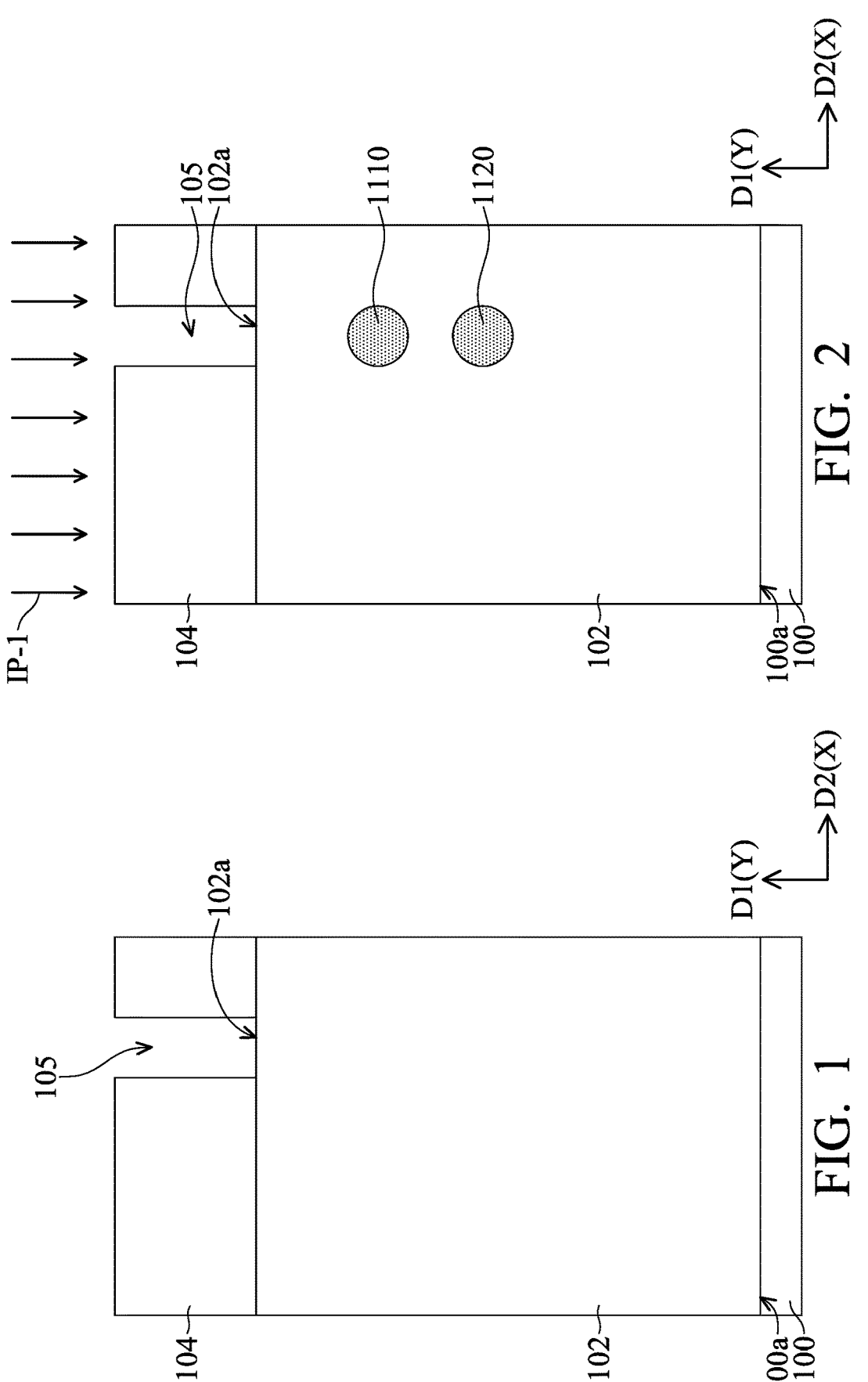

The following description provides various embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numbers and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments are described below. Throughout the various views and illustrative embodiments, similar reference numbers are used to designate similar features/components. It should be understood that additional operations can be provided before, during, and after the method, and some of the operations can be replaced or eliminated for other embodiments of the method.

Embodiments provide semiconductor devices and methods for forming the same. In some embodiments, a semiconductor device that includes a reduced surface electric field (RESURF) structure can be formed, and breakdown voltage of the semiconductor device can be increased. With the reduced surface electric field (RESURF) structure, the doping concentration of the epitaxial drift layer of the semiconductor device can be increased while maintaining the breakdown voltage of the semiconductor device, so as to reduce the on-resistance of the semiconductor device. In addition, according to a method for forming a semiconductor device that is provided in one embodiment, the manufacturing process is relatively simple, and no expensive manufacturing cost is required to manufacture the semiconductor device of the embodiment. The embodiments can be applied to metal-oxide-semiconductor (MOS) devices, such as metal-oxide-semiconductor field effect transistors (MOSFETs). In some of the embodiments described below, a trench gate MOSFET is used to illustrate a semiconductor structure. However, the present disclosure is not limited thereto. Some embodiments of the present disclosure can be applied to other types of semiconductor structures.

FIG. 1-FIG. 5 illustrate cross-sectional views of intermediate stages of a method for forming a semiconductor device in accordance with some embodiments of the present disclosure.

Referring to FIG. 1A, a substrate 100 that has a first conductivity type is provided according to some embodiments. In some embodiments, the substrate 100 is a bulk semiconductor substrate, such as a semiconductor wafer. For example, the substrate 100 is a silicon wafer. In some embodiments, the substrate 100 includes silicon or another elemental semiconductor material, such as germanium (Ge). In some embodiments, the substrate 100 includes compound semiconductor, such as silicon carbide and/or gallium nitride. In some embodiments, the substrate 100 includes alloy semiconductor, such as silicon germanium, silicon germanium carbide, or another suitable alloy semiconductor. In some embodiments, the substrate 100 includes multiple layers of materials, such as Si/SiGe or Si/SiC. In this exemplified embodiment, the substrate 100 is, for example, a silicon wafer that is doped with dopants of the first conductivity type. In the application of a vertical trench-gate MOSFET, the substrate 100 that has the first conductivity type can act as a drain region of the semiconductor device. In addition, in this exemplified embodiment, the first conductivity type is n-type, but the present disclosure is not limited thereto. In some other embodiments, the first conductivity type can be p-type.

In some embodiments, an epitaxial growth process is performed to form an epitaxial layer 102 on the substrate 100 (such as on the top surface 100a of the substrate 100). The substrate 100 and the epitaxial layer 102 have the same conductivity type, such as the first conductivity type. In this exemplified embodiment, the epitaxial layer 102 is n-type. In some embodiments, the doping concentration of the epitaxial layer 102 is less than the doping concentration of the substrate 100. In the application of a vertical trench gate MOSFET, the epitaxial layer 102 that has the first conductivity type can function as a drift region of the semiconductor device.

In some embodiments, the aforementioned epitaxial growth process can be performed by using a metal organic chemical vapor deposition (MOCVD) process, a plasma-enhanced CVD (PECVD) process, a molecular beam epitaxy (MBE) process, a hydride vapor phase epitaxy (HVPE) process, a liquid phase epitaxy (LPE) process, a chloride vapor phase epitaxy (CI-VPE) process, another suitable process or a combination thereof.

Next, a reduced surface electric field (RESURF) structure is formed in the epitaxial layer. According to the method for forming a semiconductor device of the present disclosure, doping regions that are aligned accurately without overlay shift can be formed by using a simple process. Accordingly, the electrical performance of the semiconductor device that includes the reduced surface electric field (RESURF) structure can be improved. For example, the breakdown voltage of the semiconductor device can be increased or the on-resistance of the semiconductor device can be decreased.

According to some embodiments of the present disclosure, the position of the RESURF structure can be defined by a suitable lithography patterning process. As shown in FIG. 1, a mask 104 is formed over the epitaxial layer 102, in accordance with some embodiments of the present disclosure. The mask 104 has a hole 105 that exposes the top surface 102a of the epitaxial layer 102. In some embodiments, the mask 104 is a patterned photoresist layer that is formed of a photoresist material. In some other embodiments, the mask 104 can be a hard mask (HM) that includes an oxide layer and a nitride layer.

In some embodiments, a patterned photoresist layer is used as the mask 104, the aforementioned lithography patterning process includes photoresist coating (e.g., spin-on coating), soft baking, mask alignment, exposure, post-exposure baking, developing the photoresist, rinsing and drying (e.g., hard baking), another suitable process, or a combination of the foregoing processes.

Next, one or more doping regions are formed in the epitaxial layer 102. The doping regions and the epitaxial layer 102 have different conductivity types. The location of the one or more doping regions corresponds to the hole 105 of the mask 104. For example, the doping regions are formed directly below the hole 105 of the mask 104. In this exemplified embodiment, two doping regions are formed in the epitaxial layer 102 for the illustration, but the present disclosure is not limited thereto. One, three or more doping regions can be formed in the epitaxial layer 102.

Referring to FIG. 2, in some embodiments, doping regions 1110 and 1120 are formed in the epitaxial layer 102. The doping regions 1110 and 1120 and the epitaxial layer 102 have different conductivity types. The doping regions 1110 and 1120 have, for example, second conductivity type. In this exemplified embodiment, the doping regions 1110 and 1120 have p-type conductivity. In some embodiments, the dopants of doping region 1110 and doping region 1120 include boron (B). In some embodiments, the doping concentration of the doping regions 1110 and 1120 is in the range of about 1E16 atoms/cm$^3$ to about 1E21 atoms/cm$^3$.

In some embodiments, the doping regions 1110 and 1120 that are formed in the epitaxial layer 102 are arranged along an extension direction (such as in first direction D1 (e.g., Y direction)) of the hole 105 of the mask 104. In addition, the doping regions 1110 and 1120 may be separated from each other or in contact with each other. In one example, the doping region 1110 and the doping region 1120 are separated from each other by a distance in the first direction D1. In addition, in some embodiments, the doping region that is closest to the top surface 102a of the epitaxial layer 102 (e.g., the doping region 1110 in FIG. 2) is separated from the top surface 102a by a distance.

In some embodiments, an ion implantation process IP-1 is performed to form doping regions 1110 and 1120 in the epitaxial layer 102 through the hole 105 of the mask 104. For example, one or more doping regions can be formed in the epitaxial layer 102 by blanket implant, and the mask 104 can be referred to as a protective mask during blanket implant. Formation of doping regions that have different depths in the epitaxial layer 102 can be controlled by adjusting the implant energy or using another suitable method. In some examples, the doping region 1110 that is closer to the top surface 102a of the epitaxial layer 102 can be formed by using a lower implant energy, and the doping region 1120 that is formed in a deeper position in the epitaxial layer 102 can be formed by using a higher implant energy.

Referring to FIG. 3, in some embodiments, after ion implantation process IP-1 is completed, a thermal drive-in process is selectively performed. The dopant atoms are thermally activated to achieve driven-in diffusion of dopants, and the doping regions 1110 and 1120 diffuse outwardly. In some embodiments, a critical dimension Dc of the diffused doping region 1110E and the diffused doping region 1120E in the second direction D2 (such as X direction) is greater than a width $W_H$ of the hole 105 in the second direction D2. In some other embodiments, before the thermal drive-in process is performed, the critical dimension of the doping regions that are formed by ion implantation IP-1 (such as the doping regions 1110 and 1120 in FIG. 2), which is measured in the second direction D2, is greater than the width $W_H$ of the hole 105 in the second direction D2.

Referring to FIG. 4, in some embodiments, a portion of the epitaxial layer 102, a portion of the doping region 1110E and a portion of the doping region 1120E are removed through the hole 105 to form a trench 107 in the epitaxial layer 102. The trench 107 corresponds to the position of the hole 105 and is formed below the hole 105, in accordance with some embodiments of the present disclosure. For example, the trench 107 can be referred to as an extension of the hole 105, and the trench 107 physically connects the hole 105.

The trench 107 penetrates the doping region 1110E and the doping region 1120E, and exposes the epitaxial layer 102, in accordance with some embodiments of the present disclosure. Specifically, the trench 107 penetrates from the top to the bottom of the doping region 1110E, and extends further to penetrate from the top to the bottom of the doping region 1120E. In some embodiments, the trench 107 extends beyond the lowermost doping region. For example, the trench 107 protrudes from the bottom of the doping region 1120E, so that one or more the second doping regions 12 (such as doping regions 121 and 122) that may be formed subsequently can be implanted at one or more deeper positions in the epitaxial layer 102 and closer to the substrate 100. Thus, the bottom surface 107b of the trench 107 can stop in the epitaxial layer 102 to expose the epitaxial layer 102, in accordance with some embodiments of the present disclosure.

In some embodiments, after the trench 107 that penetrates one or more doping regions is formed, the remaining portions of the one or more doping regions can be referred to as one or more first doping region(s) 11. In this exemplified embodiment, after the trench 107 is formed, the remaining portions of the doping regions 1110E and 1120E are referred to as the doping regions 111 and 112, as shown in FIG. 4. In addition, the doping regions 111 and 112 can be referred to as first doping regions 11, in accordance with some embodiments of the present disclosure.

In some embodiments, one or more etching processes can be performed to etch epitaxial layer 102 through the hole 105 of the mask 104, so as to form the trench 107 in the epitaxial layer 102. In some embodiments, the above-mentioned etching process for forming the trench 107 includes a dry etching process, a wet etching process, a plasma etching process, a reactive ion etching (RIE) process, another suitable process, or a combination of the foregoing processes. It should be noted that dimensions, shapes and positions of the hole 105 and the trench 107 in this exemplified embodiment are provided for the illustration, and the present disclosure is not limited thereto.

In some embodiments, after the trench 107 is formed, it is filled with an insulating material to form an insulating pillar 108 (as shown in FIG. 5). The RESURF structure of the semiconductor device includes the first doping regions 11 (i.e., the doping region 111 and the doping region 112). In some other embodiments, after the trench 107 is formed, an implantation can be performed in one or more deeper positions of the epitaxial layer 102 through the bottom surface 107b of the trenches 107, so one of more doping regions that have the second conductivity type (such as p-type) can be further formed in the epitaxial layer 102. The doping regions that have the second conductivity type can be referred to as second doping regions 12. After the second doping regions 12 are formed, an insulating material is filled into the trench 107. The fabrication of the second doping regions 12 in the exemplified embodiment is described below.

In some embodiments, another ion implantation process IP-2 is performed through the hole 105 of the mask 104 and the bottom surface 107b of the trench 107, so as to form one or more doping regions in one or more deeper positions of the epitaxial layer 102, as shown in FIG. 4. For example, two doping regions 121 and 122 are formed by using the ion implantation process IP-2, but the present disclosure is not limited thereto. In this exemplified embodiment, the doping regions 121 and 122 are referred to as second doping regions 12. The second doping regions 12 are formed under the first doping regions 11. In addition, the second doping regions 12 (e.g., the doping regions 121 and 122) and the first doping regions 11 have the same conductivity type, such as the second conductivity type. In this exemplified embodiment, the doping regions 121 and 122 are p-type. In some embodiments, the doping concentration of each of the doping regions 121 and 122 is in the range of about 1E16 atoms/cm³ to about 1E21 atoms/cm³.

In addition, after the semiconductor device are formed in the subsequent processes, the doping regions 11 (such as the doping region 111 and the doping region 112) are electrically connected to an electrical ground, and the doping regions 12 (such as the doping region 121 and the doping region 122) have floating potentials, in accordance with some embodiments of the present disclosure. When the doping regions 11 are electrically connected to an electrical ground, they act as super junction structures, which can effectively increase the doping concentration of the epitaxial layer 102 and the breakdown voltage of the semiconductor device. One of the purpose that is achieved by the second doping regions 12 (such as the doping region 121 and the doping region 122) with floating potentials is to reduce the surface electric field (RESURF) of the semiconductor device. In one embodiment, the super junctions of the doping regions 11 are combined with the second doping region 12, thereby reducing the resistance of the drift region and increasing the breakdown voltage of the semiconductor device.

In some embodiments, the doping region 121 and the doping region 122 that are collectively referred to as the second doping regions 12 in the epitaxial layer 102 are arranged and distributed in an extension direction (such as first direction D1) of the trench 107. In addition, the doping region 121 and the doping region 122 are separated from each other or in contact with each other. In this exemplified embodiment, the doping region 121 and the doping region 122 are separated from each other by a distance.

In addition, in some embodiments, the second doping region 12 (such as the doping region 121 in FIG. 4) that is closest to the bottom surface 107b of the trench 107 is separated from the bottom surface 107b by a distance. Accordingly, the second doping region 12 (such as the doping region 121) is formed deeper into the epitaxial layer 102 and closer to the substrate 100. For example, the topmost surface of the doping region 121 can be separated from the bottom surface 107b of the trench 107 by a first distance d1. The topmost surface of the second doping region 12 (such as the doping region 121) that is closest to the bottom surface 107b of the trench 107 is separated from the bottommost surface of the adjacent first doping region 11 (such as the doping region 112) by a second distance d2, in accordance with some embodiments of the present disclosure. The second distance d2 can be greater than, equal to, or less than the first distance d1, depending on the requirements of the electrical properties (such as breakdown voltage, on-resistance and so on) of the semiconductor device.

In some embodiments, the doping region 121 and the doping region 122 are formed in the epitaxial layer 102 by performing a blanket ion implantation over the mask 104 and through the trench 107. Meanwhile, the mask 104 can be referred to as a protective mask. In some examples, the doping region 121 that is at a shallower position in the epitaxial layer 102 can be formed by using a lower implant energy for ion implantation, and the doping region 122 that is at a deeper position in the epitaxial layer 102 can be formed by using a higher implant energy for ion implantation. The formation of the doping regions 121 and 122 in different depths of the epitaxial layer 102 can be controlled by adjusting the implantation energy. Formation of the doping region 121 and the doping region 122 that have different depths in the epitaxial layer 102 can be controlled by adjusting the implant energy or using another suitable method.

According to the electrical requirements of a semiconductor device, if more doping regions need to be formed in the epitaxial layer 102 toward the substrate 100, the following steps can be repeatedly performed with reference to the processes that are proposed in the abovementioned embodiment. For example, a thermal drive-in process is selectively performed to diffuse the doping region 121 and the doping region 122 outwardly (FIG. 3). Next, the extended trench 107 is extended by an etching process, so that the extended trench 107 penetrates the diffused doping region 121 and the diffused doping region 122. The doping regions 111, 112, 121 and 122 that are penetrated by the trench 107 can be referred to as the first doping regions 11. Next, another ion implantation process is performed through the extended trench 107 (such as through the bottom surface of the trench 107), so as to form one or more doping regions in the deeper portion of the epitaxial layer 102. Those doping regions that are formed in the deeper portion of the epitaxial layer 102 can be referred to as the second doping regions 12. In some embodiments, as the trench 107 extends further into the epitaxial layer 102, the number of the first doping regions 11 that are formed in the epitaxial layer 102 and penetrated by the trench 107 can be greater than the number of the second doping regions that are not penetrated by the trench 107. the number of impurity regions 12, and the greater the number of impurity regions formed in the epitaxial layer 102. In addition, as the trench 107 extends further into the epitaxial layer 102, more doping regions can be formed in the epitaxial layer 102, in accordance with some embodiments of the present disclosure.

Therefore, according to the manufacturing method provided in the present disclosure, several doping regions that are arranged in a good alignment can be formed in the epitaxial layer 102 by a simple process (such as the formation and extension of the trench 107 and the formation of one or more doping regions through the trench 107). Formation of the doping regions of the embodiments does not require complicated procedures, such as several epitaxial processes and implantation processes that are repeatedly performed in a conventional method. In addition, more processes that are performed for manufacturing a semiconductor device are prone to the risk of impurity contamination, which causes epitaxial defects. The manufacturing method in the embodiments of the present disclosure provides one-step for forming the epitaxial layer 102, which can reduce the risk of epitaxial defects. In addition, the overlay between the doping regions that are formed using the conventional method will increase the alignment difficulty of photolithography, and offset easily occurs between the doping regions. However, according to the manufacturing method in the embodiments of the present disclosure, the overlay between the doping regions can be easily and accurately controlled by using an extension direction of the trench 107 in the epitaxial layer 102.

Referring to FIG. 5, after the doping regions (such as the first doping regions 11 or the combination of the first doping regions 11 and the second doping regions 12) are formed, an insulating material is filled into the trench 107 to form an insulating pillar 108, in accordance with some embodiments of the present disclosure. The insulating pillar 108 includes, for example, one or more insulating components.

Specifically, in some embodiments, after the doping regions are formed, the mask 104 is removed. Then, an insulating material layer (not shown) is formed over the epitaxial layer 102, and the insulating material layer fills the trench 107. Next, a planarization process is performed on the insulating material layer to remove a portion of the insulating material layer above the epitaxial layer 102 until the epitaxial layer 102 is exposed. Next, a cleaning process, such as using a hydrofluoric acid (HF) solution, is performed to remove residue that may be left after the planarization process. For example, after a chemical mechanical polishing/planarization (CMP) is completed, a cleaning process is performed to remove CMP slurry residue.

In some embodiments, the mask 104 can be removed by using an ashing process, a wet etching process (such as acid etching), or another acceptable and suitable removing process.

In some embodiment, the forgoing insulating material layer includes an oxide or another suitable insulating material to form a single-layer structure or a multilayer structure. For example, the insulating material layer may include silicon oxide, tetraethyl orthosilicate (TEOS) oxide, phospho-silicate glass (PSG), boro-silicate glass (BSG), fluoro-silicate glass (FSG), boron-doped phospho-silicate glass (BPSG), oxides of undoped silicon glass (USG), the like, or a combination of the foregoing materials. The forgoing insulating material layer can be formed by a chemical vapor deposition (CVD) process, a plasma-enhanced chemical vapor deposition (PECVD) process, a flowable chemical vapor deposition (FCVD) process, another suitable method, or a combination thereof.

In some embodiments, the planarization process that is performed on the above-mentioned insulating material layer includes a chemical mechanical polishing (CMP) process, a mechanical polishing process, an etching process, another suitable process, or a combination of the foregoing processes. In this exemplified embodiment, parts of the insulating material layer is removed by a chemical mechanical polishing (CMP) process, and the top surface 102a of the epitaxial layer 102 is exposed. After the planarization process, the remaining portion of the insulating material layer fills the trench 107 to form the insulating pillar 108 that penetrates the first doping regions 11. The top surface 108a of the insulating pillar 108 is, for example, level with the top surface 102a of the epitaxial layer 102.

In addition, as shown in FIG. 5, although two first doping regions 11 that are arranged to surround the insulating pillar 108 and two second doping regions 12 that are arranged under the insulating pillar 108 are referred to as a RESURF structure of the embodiment, the present disclosure is not limited to this configuration. FIGS. 6A, 6B, 6C, 6D, 6E, 6F, 6G, 6H and 6I illustrate cross-sectional views of the configurations of doping regions in various RESURF structures in accordance with some embodiments of the present disclosure. These configurations of doping regions are provided for illustrative purposes only.

Figures 6A, 6B, 6C, 6D, 6E, 6F:
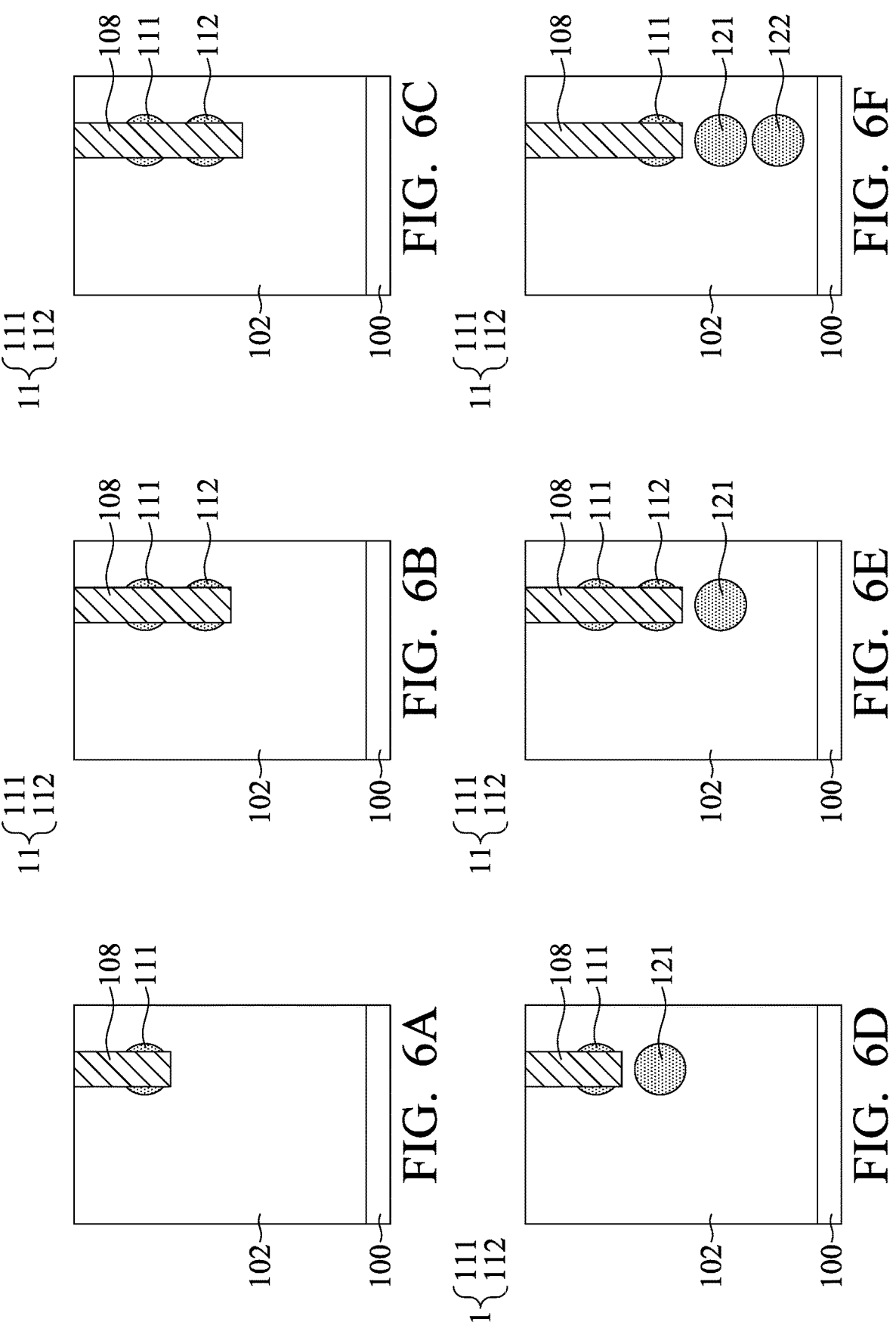

In some embodiments, as shown in FIG. 6A, the RESURF structure includes a doping region 111 that can be referred to as a first doping region 11. The first doping region 11 is disposed to surround the insulating pillar 108.

In some embodiments, as shown in FIG. 6B, the RESURF structure includes two doping regions 111 and 112 that can be referred to as the first doping regions 11. The first doping regions 11 are disposed to surround the insulating pillar 108. In addition, the doping region 111 and the doping region 112 are separated from each other by a distance in this exemplified embodiment.

In some embodiments, as shown in FIG. 6C, the RESURF structure includes two doping regions 111 and 112 that can be referred to as the first doping regions 11. The first doping regions 11 are disposed to surround the insulating pillar 108. In addition, the difference between the configurations of FIG. 6B and FIG. 6C is that the doping region 111 and the doping region 112 of FIG. 6C are physically connected to each other.

In some embodiments, as shown in FIG. 6D, the RESURF structure includes a doping region 111 that can be referred to as a first doping region 11. The first doping region 11 is disposed to surround the insulating pillar 108. The RESURF structure further includes a doping region 121 that can be referred to as a second doping region 12. The doping region 121 is disposed under the insulating pillar 108. In addition, the doping region 121 and the insulating pillar 108 are separated from each other by a distance in this exemplified embodiment.

In some embodiments, as shown in FIG. 6E, the RESURF structure includes the doping region 111 and the doping region 112 that can be referred to as the first doping regions 11. The doping region 111 and the doping region 112 are separated from each other and disposed to surround the insulating pillar 108. The RESURF structure further includes a doping region 121 that can be referred to as a second doping region 12. The doping region 121 is disposed under the insulating pillar 108. In addition, the doping region 121 and the insulating pillar 108 are separated from each other by a distance.

In some embodiments, as shown in FIG. 6F, the RESURF structure includes a doping region 111 that can be referred to as a first doping region 11. The first doping region 11 is disposed to surround the insulating pillar 108. The RESURF structure further includes two doping regions 121 and 122 that can be referred to as the second doping regions 12. The doping region 121 and the doping region 122 that are separated from each other are disposed under the insulating pillar 108. In addition, the doping region 121 and the insulating pillar 108 are separated from each other by a distance.

In some embodiments, as shown in FIG. 6G, the RESURF structure includes two doping regions 111 and 112 that can be referred to as the first doping regions 11. The doping region 111 and the doping region 112 are disposed to surround the insulating pillar 108. The RESURF structure further includes two doping regions 121 and 122 that can be referred to as the second doping regions 12. The doping region 121 and the doping region 122 that are separated from each other are disposed under the insulating pillar 108. In addition, the doping region 121 and the insulating pillar 108 are separated from each other by a distance.

In some embodiments, as shown in FIG. 6H, the RESURF structure has a configuration of doping regions that is identical to that of FIG. 6G, except that the doping region 111 and the doping region 112 (that can be referred to as the first doping regions 11) of FIG. 6H are physically connected to each other. In addition, the doping region 121 and the doping region 122 (that can be referred to as the second doping regions 12) are physically connected to each other.

In some embodiments, as shown in FIG. 6I, the RESURF structure includes four doping regions, for example, the doping regions 111, 112, 113 and 114, that can be referred to as the first doping regions 11. The doping region 111, the doping region 112, the doping region 113 and the doping region 114 are separated from each other and disposed to surround the insulating pillar 108. The RESURF structure further includes two doping regions 121 and 122 that can be referred to as the second doping regions 12. The doping region 121 and the doping region 122 that are separated from each other are disposed beneath the insulating pillar 108. In addition, the doping region 121 and the insulating pillar 108 are separated from each other by a distance. Compared to the above-mentioned RESURF structures of FIG. 6A to FIG. 6H, more doping regions that are referred to as the first doping regions 11 are formed in the epitaxial layer 102 of the RESURF structure of FIG. 6I, and the insulating pillar 108 penetrates more first doping regions 11. Accordingly, the depth of the RESURF region can be increased, in accordance with the embodiments of the present disclosure.

A gate structure of the semiconductor device is formed subsequently after the doping regions (such as one or more first doping regions 11, or a combination of one or more first doping regions 11 and one or more second doping regions 12) and the insulating pillar 108 are formed, in accordance with some embodiments of the present disclosure. The gate structure is formed at one lateral side of the RESURF structure. In the following example, a split trench gate structure is used to illustrate a gate structure in a semiconductor device for description. However, the present disclosure is not limited thereto. In some other embodiments, the semiconductor device may include a general type of a trench gate structure. FIG. 7-FIG. 12 illustrate cross-sectional views of various manufacturing stages of a method for forming a gate structure in accordance with some embodiments of the present disclosure.

Figures 7, 8:
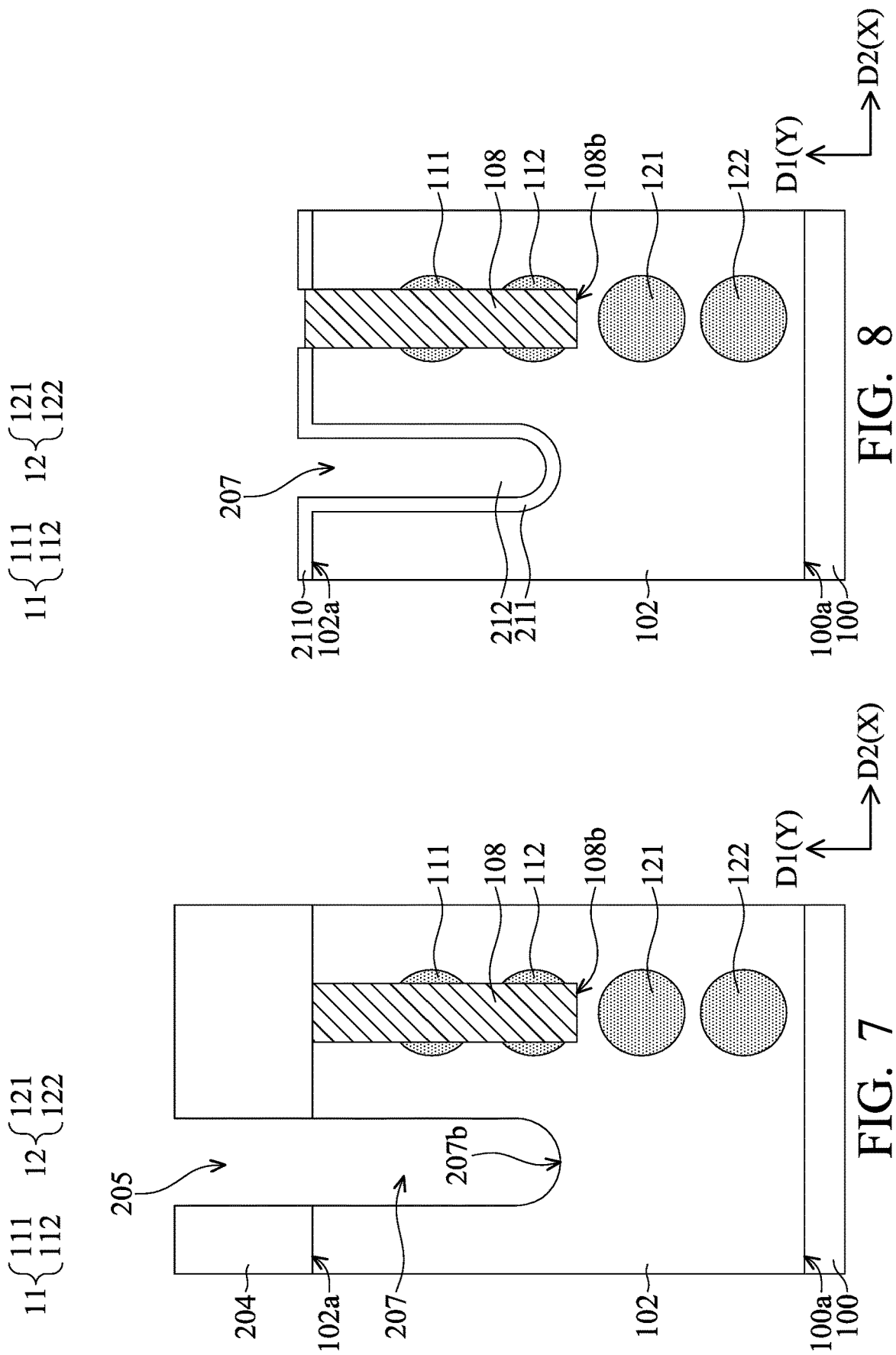
FIG. 7, FIG. 8, FIG. 9, FIG. 10, FIG. 11 and FIG. 12 illustrate cross-sectional views of various manufacturing stages of a method for forming a gate structure in accordance with some embodiments of the present disclosure.

The position of the gate structure can be defined by an appropriate lithography patterning process, in accordance with some embodiments of the present disclosure. Referring to FIG. 7, in some embodiments, a recess 207 is formed in the epitaxial layer 102 and positioned at one side of the insulating pillar 108. The recess 207 is separated from the insulating pillar 108 by a distance in the second direction D2. In some exemplified embodiments, a mask 204 is formed over the epitaxial layer 102. The mask 204 has an opening 205 that exposes the top surface 102a of the epitaxial layer 102.

In some embodiments, a patterned photoresist layer that is formed of photoresist material is used as the mask 204. In some other embodiments, the mask 204 is a hard mask (HM) that includes an oxide layer and a nitride layer. In some examples that uses a patterned photoresist as the mask 204, the aforementioned lithography patterning process includes photoresist coating (e.g., spin-on coating), soft baking, mask alignment, exposure, post-exposure baking, developing the photoresist, rinsing and drying (e.g., hard baking), another suitable process or a combination of the foregoing processes to form the opening 205.

As shown in FIG. 7, after the mask 204 is formed, a portion of the epitaxial layer 102 is removed through the opening 205 of the mask 204 to form a recess 207 in the epitaxial layer 102, in accordance with some embodiments of the present disclosure. In some embodiments, the position of the recess 207 corresponds to the opening 205 and the recess 207 is formed under the opening 205. The recess 207 is, for example, an extension of the opening 205 and physically connected to the opening 205. In some embodiments, the depth of the recess 207 in the epitaxial layer 102 (for example, along the first direction D1) may be greater than, less than, or equal to the depth of the insulating pillar 108 in the epitaxial layer 102 (for example, along the first direction D1). In this exemplified embodiment, the bottom surface 108b of the insulating pillar 108 is closer to the substrate 100 than the bottom surface 207b of the recess 207.

In some embodiments, one or more etching processes can be performed to etch epitaxial layer 102 through the opening 205 of the mask 204, so as to form the recess 207 in the epitaxial layer 102. In some embodiments, the etching process may include a dry etching process, a wet etching process, a plasma etching process, a reactive ion etching (RIE) process, another suitable process, or a combination of the foregoing processes. In addition, it should be noted that dimensions, shapes and positions of the opening 205 and the recess 207 are provided for illustrative purposes, and the embodiments of the present invention are not limited thereto.

After the recess 207 is formed in the epitaxial layer 102, the mask 204 can be removed, in accordance with some embodiments of the present disclosure. The mask 204 can be removed by using an ashing process, a wet etching process (such as acid etching), or another acceptable and suitable removing process. In some embodiments, a cleaning process can be selectively performed to remove residual material after the mask 204 is removed.

Next, a liner layer is formed in the recess 207 and a gate electrode is formed on the liner layer in the recess 207, in accordance with some embodiments of the present disclosure. In the following exemplified embodiment, a split trench gate structure that includes a top gate electrode and a bottom gate electrode is used as an example to illustrate a gate structure, but the present disclosure is not limited thereto.

Referring to FIG. 8, in some embodiments, a shield insulating layer 2110 is formed on the sidewalls of the recess 207 and the top surface 102a of the epitaxial layer 102. In some embodiments, the shielding insulating layer 2110 includes silicon oxide, germanium oxide, another suitable semiconductor oxide material, or a combination of the foregoing materials. In some exemplified embodiments, the shielding insulating layer 2110 is conformably formed on the sidewalls and the bottom surface 207b of the recess 207 and the top surface 102a of the epitaxial layer 102 by an oxidation process. In some embodiments, the oxidation process includes a thermal oxidation, a radical oxidation, or another suitable process.

In some embodiments, a thermal process can be selectively performed on the shielding insulating layer 2110 to increase the density of the shielding insulating layer 2110. The aforementioned thermal process that is selectively performed can be a rapid thermal annealing (RTA) process or another suitable process, in accordance with some embodiments of the present disclosure.

Figures 9, 10:
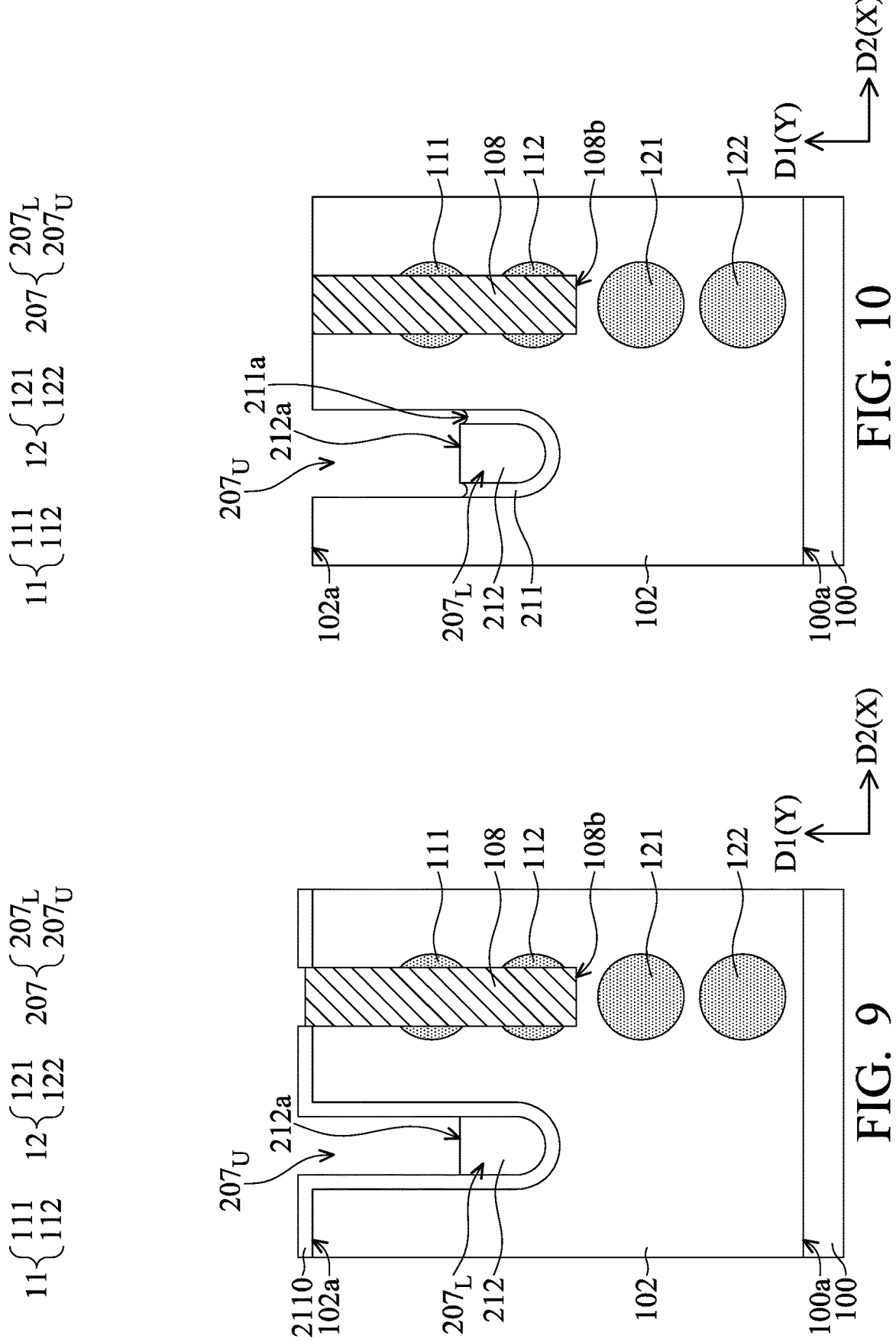

Next, referring to FIG. 9, a bottom gate electrode 212 is formed in a lower portion 207L of the recess 207, in accordance with some embodiments of the present disclosure. The bottom gate electrode 212 is formed on the shielding insulating layer 2110. The top surface 212a of the bottom gate electrode 212 is lower than the top surface 102a of the epitaxial layer 102. In some embodiments, the bottom gate electrode 212 is a single-layer structure or a multilayer structure. The bottom gate electrode 212 may include amorphous silicon, polysilicon, or a combination of the foregoing materials. The bottom gate electrode 212 is separated from the epitaxial layer 102 by the shielding insulating layer 2110.

A first gate electrode material (not shown) can be deposited on the shielding insulating layer 2110 by a deposition process, in accordance with some embodiments of the present disclosure. The first gate electrode material fills the empty space outside the shielding insulating layer 2110 in the recess 207. In addition, a thermal process, such as an annealing process, can be selectively performed on the first gate electrode material. Next, a portion of the first gate electrode material is removed to form the bottom gate electrode 212, as shown in FIG. 9.

In some exemplified embodiments, the aforementioned deposition process can be a physical vapor deposition (PVD) process, a chemical vapor deposition (CVD) process, another suitable process, or a combination of the forgoing processes.

In some exemplified embodiments, the above-mentioned steps for removing a portion of the first gate electrode material may include, but not limited to, removing an excess portion of the first gate electrode material by a planarization process to expose the shielding insulating layer 2110. For example, the portion of the first gate electrode material that is over the top surface 102a of the epitaxial layer 102 is removed to expose the shielding insulating layer 2110. The above-mentioned planarization process is, for example, a chemical mechanical polishing (CMP) process, a mechanical polishing process, an etching process, another suitable process, or a combination of the foregoing processes. Next, the portion of the first gate electrode material in the recess 207 is etched back so that the first gate electrode material is recessed to a specific depth to form a bottom gate electrode 212 in the recess 207. In some exemplified embodiments, after the first gate electrode material is etched back, the top surface 212a of the remaining portion of the first gate electrode material (i.e., the bottom gate electrode 212) is lower than the top surface 102a of the epitaxial layer 102, and is also lower than the topmost portion of the first doping region 11 (such as the doping region 111) that is closest to the top surface 102a of the epitaxial layer 102.

In some embodiments, the bottom gate electrode 212 selectively includes dopants of the second conductivity type. In this exemplified embodiment, the second conductivity type is p-type. In some embodiments, the dopants of the bottom gate electrode 212 may be boron difluoride ($BF_2$) or another suitable material. According to the embodiments, the bottom gate electrode 212 of the split trench gate structure can reduce the gate-drain capacitance (Cgd), so that the switching characteristics of the semiconductor device can be improved. In addition, the split trench gate structure has the bottom gate electrode 212 of the second conductivity type can further enhance the reduced surface electrical field (RESURF) effect, in accordance with some embodiments of the present disclosure.

Next, referring to FIG. 10, an upper portion of the shielding insulating layer 2110 is removed in accordance with some embodiments of the present disclosure. The remaining portion of the shielding insulating layer 2110 forms an insulating layer 211 on the sidewall and the bottom surface of the lower portion 207L of the recess 207. The upper portion of the shielding insulating layer 2110 may be removed by an etching process. In some embodiments, the aforementioned etching process is a dry etching process, a wet etching process, a plasma etching process, a reactive ion etching (RIE) process, another suitable process, or a combination of the foregoing processes.

In some embodiments, after the upper portion of the shielding insulating layer 2110 is removed, the top surface 211a of the insulating layer 211 is higher than (not shown) the top surface 212a of the bottom gate electrode 212. In some other embodiments, the top surface 211a of the insulating layer 211 is lower than the top surface 212a of the bottom gate electrode 212 after the upper portion of the shielding insulating layer 2110 is removed. In some other embodiments, the top surface 211a of the insulating layer 211 is substantially coplanar with the top surface 212a of the bottom gate electrode 212 after the upper portion of the shielding insulating layer 2110 is removed. In this exemplified embodiment, the top surface 211a of the insulating layer 211 is substantially coplanar with the top surface 212a of the bottom gate electrode 212, and the top surface 211a has a slight dishing profile, as shown in FIG. 10.

Figures 11, 12:
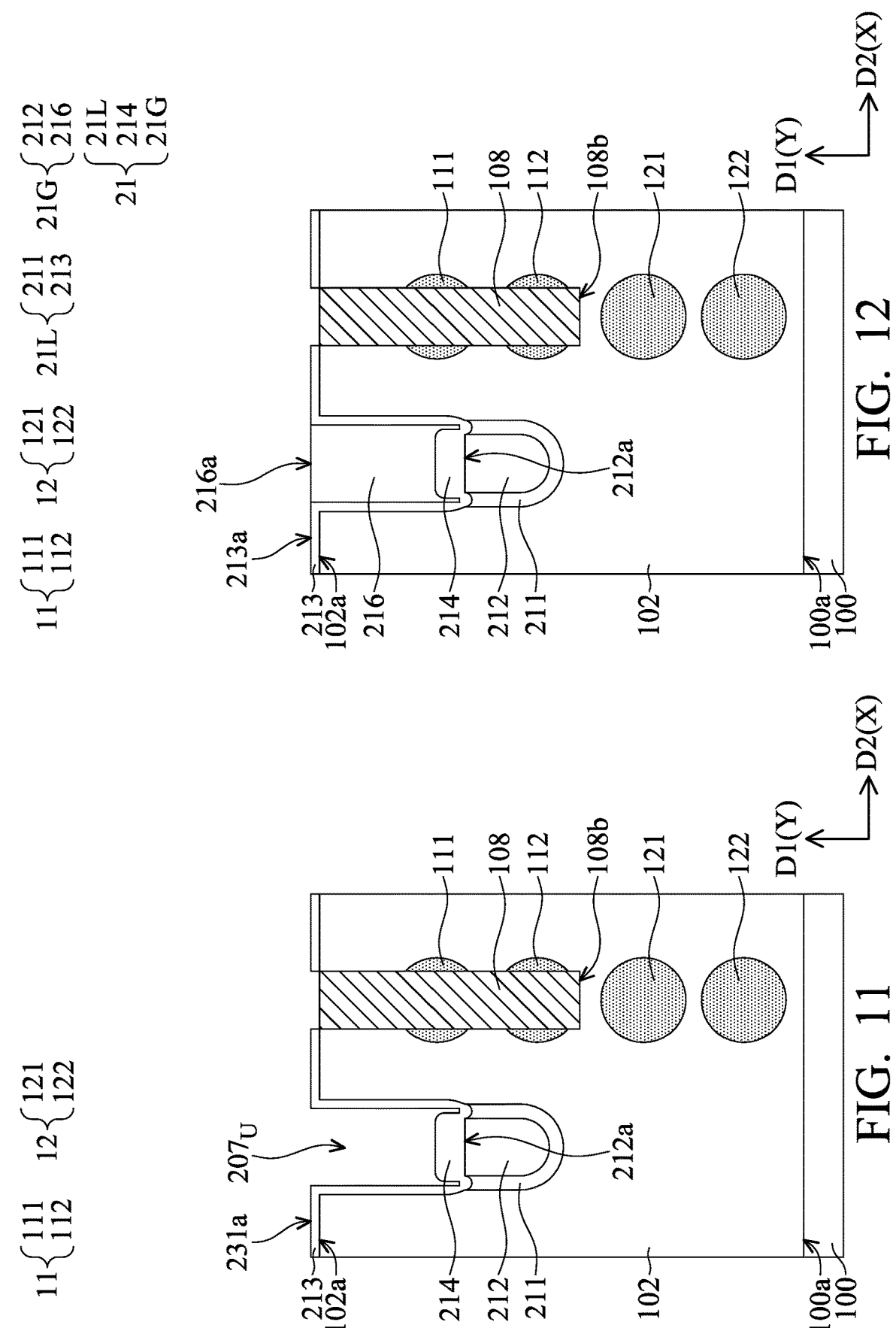

Next, referring to FIG. 11, a dielectric layer 213 is formed over the epitaxial layer 102, the insulating layer 211 and the bottom gate electrode 212, in accordance with some embodiments of the present disclosure. The dielectric layer 213 may serve as a gate dielectric layer for the subsequently formed top gate electrode 216 (FIG. 12).

In some embodiments, the dielectric layer 213 extends from the top surface 102a of the epitaxial layer 102 to the upper portion 207u of the recess 207, and covers the top surface 211a of the insulating layer 211 and the top surface 212a of the bottom gate electrode 212. In this embodiment, the dielectric layer 213 does not fully fill the recess 207. That is, after the dielectric layer 213 is formed, there is a space on the dielectric layer 213 in the recess 207. In addition, in some embodiments, the thickness of the dielectric layer 213 that is deposited on the sidewalls of the upper portion 207u of the recess 207 is less than the thickness of the insulating layer 211 that is deposited on the sidewalls of the lower portion 207L of the recess 207.

In some embodiments, the dielectric layer 213 includes silicon oxide, hafnium oxide, zirconium oxide, aluminum oxide, hafnium aluminum oxide, hafnium silicon dioxide, hafnium silicon oxynitride, hafnium tantalum oxide, hafnium titanium oxide, hafnium zirconium oxide, another suitable high-k dielectric material, or a combination of the foregoing materials. In some embodiments, the material of the dielectric layer 213 is different from the material of the underlying insulating layer 211. In some other embodiments, the material of the dielectric layer 213 is the same as the material of the insulating layer 211.

The dielectric layer 213 can be formed on the epitaxial layer 102, the insulating layer 211 and the bottom gate electrode 212 by a deposition process, in accordance with some embodiments of the present disclosure. The deposition process is, for example, a conformal deposition process. In some embodiments, the deposition process can be a physical vapor deposition (PVD) process, a chemical vapor deposition (CVD) process, an atomic layer deposition (ALD) process, another suitable deposition process, or a combination of the forgoing processes.

In addition, the bottom gate electrode 212 is oxidized when the dielectric layer 213 is formed, in accordance with some embodiments of the present disclosure. Thus, an insulating portion 214 that is thicker than the dielectric layer 213 is formed over the bottom gate electrode 212. The insulating portion 214 includes, for example, an isolation oxide. After a top gate electrode 216 (in FIG. 12) is subsequently formed, the insulating portion 214 is positioned between the bottom gate electrode 212 and the top gate electrode 216 for providing electrical isolation between the bottom gate electrode 212 and the top gate electrode 216.

Then, referring to FIG. 12, a top gate electrode 216 is formed in the upper portion 207u of the recess 207 in accordance with some embodiments of the present disclosure. The top gate electrode 216 is formed on the dielectric layer 213 and is separated from the underlying bottom gate electrode 212 by the insulating portion 214. In some embodiments, the top surface 216a of the top gate electrode 216 is level with the top surface 213a of the dielectric layer 213. The top gate electrode 216 may be a single-layer structure or a multilayer structure.

In some embodiments, the top gate electrode 216 includes amorphous silicon, polysilicon, one or more metals, metal nitrides, metal silicides, conductive metal oxides, or a combination of the foregoing materials. In some examples, the aforementioned metals may include, but are not limited to, molybdenum (Mo), tungsten (W), titanium (Ti), tantalum (Ta), platinum (Pt) or hafnium (Hf). The aforementioned metal nitrides may include, but are not limited to, molybdenum nitride (MoN), tungsten nitride (WN), titanium nitride (TiN), and tantalum nitride (TaN). The aforementioned metal silicides may include, but is not limited to, tungsten silicide ($WSi_x$). The aforementioned conductive metal oxides may include, but are not limited to, ruthenium metal oxide ($RuO_2$) and indium tin oxide (ITO). In addition, in some embodiments, the top gate electrode 216 selectively includes dopants having the second conductivity type. In this exemplified embodiment, the second conductivity type is p-type.

In some embodiments, a second gate electrode material (not shown) can be deposited on the dielectric layer 213 by a deposition process. The second gate electrode material fills the space that is in the upper portion 207$u$ of the recess 207 and outside the dielectric layer 213. In addition, a thermal process, such as an annealing process, can be selectively performed on the second gate electrode material. Next, a portion of the second gate electrode material is removed to form the top gate electrode 216 as shown in FIG. 12. In some embodiments, the second gate electrode material that is used to form the top gate electrode 216 is the same as the first gate electrode material that is used to form the bottom gate electrode 212. In some other embodiments, the second gate electrode material that is used to form the top gate electrode 216 is different from the first gate electrode material that is used to form the bottom gate electrode 212.

In some exemplified embodiments, the aforementioned deposition process can be a physical vapor deposition (PVD) process, a chemical vapor deposition (CVD) process, another suitable process, or a combination of the forgoing processes.

In some exemplified embodiments, the above-mentioned steps of removing a portion of the second gate electrode material may include (but not limited to) removing the excess portion of the second gate electrode material by a planarization process. For example, the portion of the second gate electrode material that is above the top surface 102$a$ of the epitaxial layer 102 and on the dielectric layer 213 is removed to expose the dielectric layer 213. The above-mentioned planarization process is, for example, a chemical mechanical polishing (CMP) process, a mechanical polishing process, an etching process, another suitable process, or a combination of the foregoing processes. After the planarization process, the top surface 216$a$ of the top gate electrode 216 is substantially level with the top surface 213$a$ of the dielectric layer 213, in accordance with some embodiments of the present disclosure.

The insulating layer 211 and the dielectric layer 213 collectively form a liner 21L in the recess 207, and the bottom gate electrode 212 and the top gate electrode 216 collectively form a gate electrode 21G, in accordance with some embodiments of the present disclosure. In this exemplified embodiment, the gate structure 21 includes the liner 21L, the insulating portion 214 and the gate electrode 21G. However, the present disclosure is not limited to this exemplary structure.

According to some embodiments of the present disclosure, the bottom gate electrode 212 under the top gate electrode 216 can reduce a gate-drain capacitance (Cgd) at the recess bottom of a conventional super junction split trench gate MOSFET, thereby effectively decreasing the gate-drain charge (Qgd) to improve switch performance characteristics of the semiconductor device. However, the present disclosure is not limited to the split trench gate structure, and the semiconductor device may include a general trench gate structure.

Figures 13, 14:
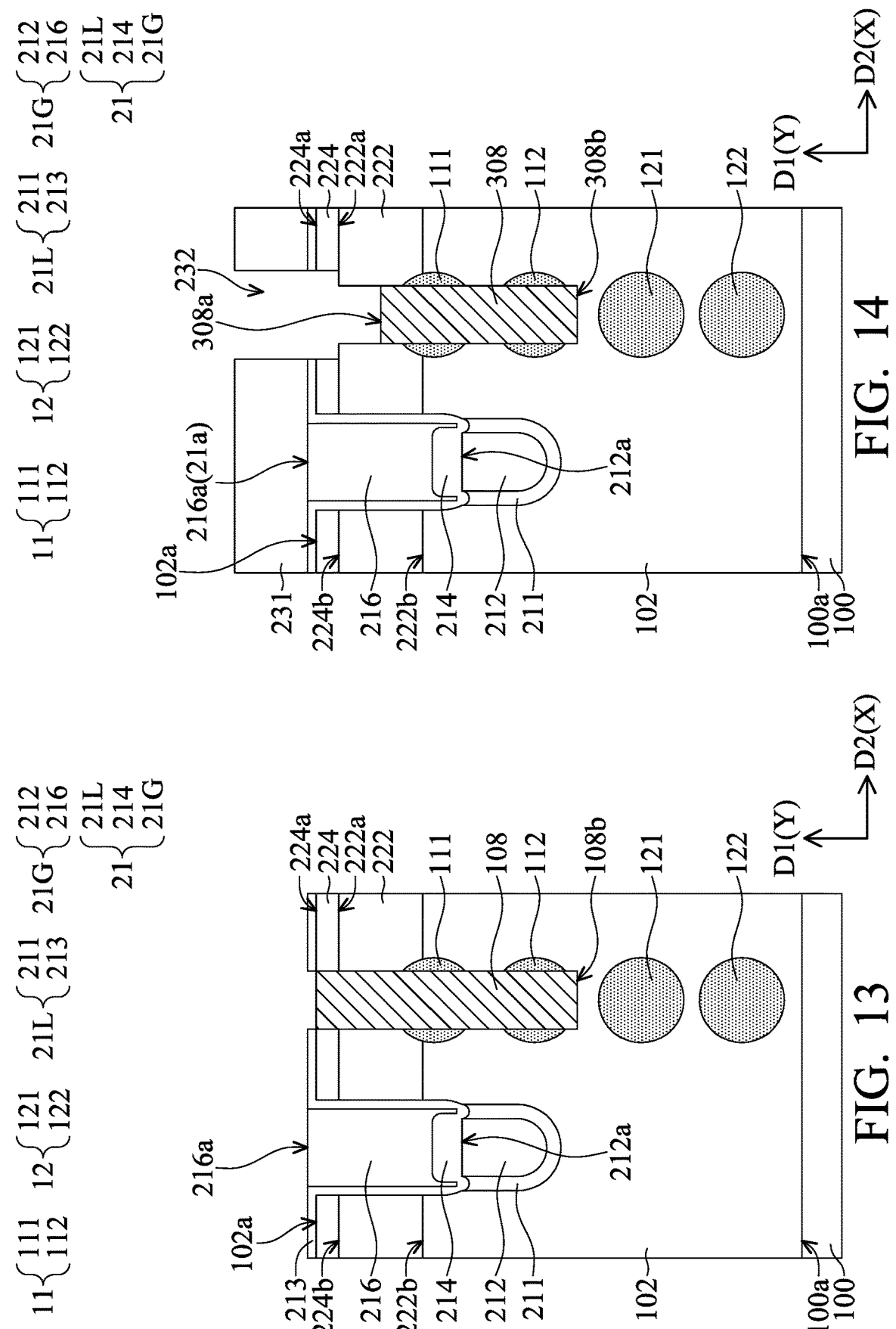
FIG. 13 is a cross-sectional view of a well region and a heavily doped source region in accordance with some embodiments of the present disclosure.
FIG. 14, FIG. 15 and FIG. 16 illustrate cross-sectional views of intermediate stages for forming a contact plug in accordance with some embodiments of the present disclosure.

Next, referring to FIG. 13, in some embodiments, a well region 222 is formed in the epitaxial layer 102. The well region 222 has a conductivity type that is different from the conductivity type of the epitaxial layer 102. The well region 222 has the second conductivity type. In this exemplified embodiment, the second conductivity type is p-type and the well region 222 can be referred to as a p-body region. In addition, the well region 222 and the doping regions 111, 112, 121 and 122 have the same conductivity type. In some embodiments, the doping concentration of the well region 222 is less than the doping concentration of the doping regions 111, 112, 121 and 122. In some embodiments, the doping concentration of the well region 222 is in the range of about 1E16 atoms/$cm^3$ to about 1E18 atoms/$cm^3$. According to some embodiments, the well region 222 functions as a channel region of a semiconductor device.

In some embodiments, the well region 222 can be formed in the epitaxial layer 102 through an ion implantation process. The well region 222 extends downward from the top surface 102$a$ of the epitaxial layer 102 into the epitaxial layer 102. In some exemplified embodiments, as shown in FIG. 13, the bottom surface 222$b$ of the well region 222 is higher than the top surface 212$a$ of the bottom gate electrode 212. In addition, in some embodiments, the well region 222 surrounds the top gate electrode 216 of the gate structure and surrounds the insulating pillar 108. In some exemplified embodiments, the well region 222 is in direct contact with the sidewalls of the insulating pillar 108 and in direct contact with the top gate electrode 216 of the gate structure. In some exemplified embodiments, the doping regions 111, 112, 121 and 122 are positioned at the outside of the well region 222.

Next, referring to FIG. 13, a heavily doped region 224 is formed in the well region 222, in accordance with some embodiments of the present disclosure. The heavily doped region 224 and the epitaxial layer 102 have the same conductivity type, such as the first conductivity type. In this example, the heavily doped region 224 is n-type. In some embodiments, the doping concentration of the heavily doped region 224 is greater than the doping concentration of the epitaxial layer 102. In some embodiments, the doping concentration of each of the substrate 100 and the heavily doped region 224 is in the range of about 1E19 atoms/$cm^3$ to about 1E21 atoms/$cm^3$. In some embodiments, the doping concentration of the epitaxial layer 102 is in the range of about 1E18 atoms/$cm^3$ to about 1E18 atoms/$cm^3$. In addition, the heavily doped region 224 may function as a source region of a semiconductor device, in accordance with some embodiments of the present disclosure.

In some embodiments, another ion implantation process can be performed on the top surface 102$a$ of the epitaxial layer 102 to form the heavily doped region 224 in the well region 222. Thus, the heavily doped region 224 extends from the top surface 102$a$ of the epitaxial layer 102 into the well region 222. As shown in FIG. 13, the bottom surface 224$b$ of the heavily doped region 224 is higher than the bottom surface 222$b$ of the well region 222, in accordance with some embodiments of the present disclosure. The bottom surface 224$b$ of the heavily doped region 224 is also higher than the top of the first doping region (such as the top of the doping region 111 in FIG. 13) that is positioned closest to the top surface 102$a$ of the epitaxial layer 102. In addition, in some embodiments, the heavily doped region 224 surrounds the top gate electrode 216 of the gate structure and surrounds the insulating pillar 108. In some examples, the heavily doped region 224 is in direct contact with the sidewalls of the insulating pillar 108 and in direct contact with the top gate electrode 216 of the gate structure.

Figures 15, 16:
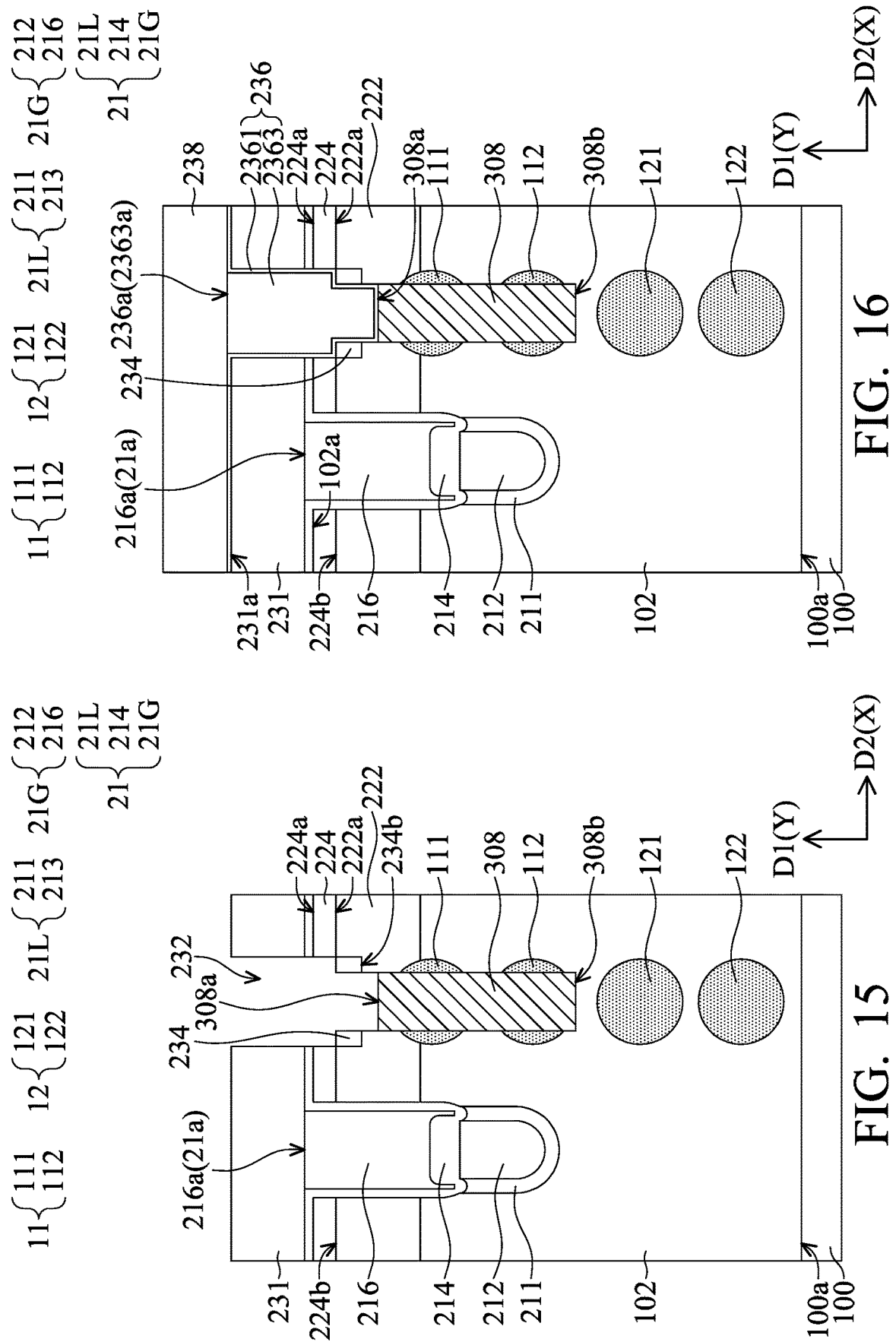

After the aforementioned one or more doping regions (such as the doping regions 111, 112, 121 and 122), the insulating pillar 108, the gate structure 21, the well region 222 and the heavy doping region 224 are completed formed, a contact plug 236 (FIG. 16) is subsequently formed to electrically connect the well region 222 and the heavily doped region 224, in accordance with some embodiments of the present disclosure. FIG. 14-FIG. 16 illustrate cross-sectional views of intermediate stages for forming a contact plug in accordance with some embodiments of the present disclosure.

Referring to FIG. 14, an interlayer dielectric (ILD) layer 231 is formed on the heavily doped region 224, in accordance with some embodiments of the present disclosure. In this exemplified embodiment, the interlayered dielectric layer 231 has a contact hole 232 that exposes the heavily doped region 224, the well region 222 and the insulating pillar 308.

In some embodiments, the interlayer dielectric layer 231 includes silicon oxide, another suitable low dielectric constant (low-k) dielectric material, or a combination of the foregoing materials. In some embodiments, the material of the interlayer dielectric layer 231 is different from the material of the dielectric layer 213. In some other embodiments, the material of the interlayer dielectric layer 231 is the same as the material of the dielectric layer 213.

The interlayer dielectric layer 231 that has a contact hole 232 can be formed by a deposition process, a lithography patterning process and an etching process, in accordance with some embodiments of the present disclosure. In one exemplified embodiment, an interlayer dielectric material (not shown) is deposited on and covers the dielectric layer 213 (over the heavily doped region 224), the top gate electrode 216 and the insulating pillar 108. Next, one or more etching processes are performed to remove a portion of the interlayer dielectric material, a portion of the heavily doped region 224, a portion of the well region 222 and a portion of the insulating pillar 108 to form the contact hole 232, in accordance with some embodiments of the present disclosure.

In some embodiments, the aforementioned deposition process can be a physical vapor deposition (PVD) process, a chemical vapor deposition (CVD) process, another suitable process, or a combination of the forgoing processes. In addition, the aforementioned lithography patterning process may include photoresist coating (e.g., spin-on coating), soft baking, mask alignment, exposure, post-exposure baking, developing the photoresist, rinsing and drying (e.g., hard baking), another suitable process or a combination of the foregoing processes, in accordance with some embodiments of the present disclosure. In some embodiments, the aforementioned etching process includes a dry etching process, a wet etching process, a plasma etching process, a reactive ion etching process, other suitable processes, or a combination of the foregoing processes.

According to the semiconductor device of some embodiments of the present disclosure, after the contact hole 232 is formed, the remaining portion of the insulating pillar 108 is referred to as an insulating pillar 308 of the RESURF structure. In some exemplified embodiments, the contact hole 232 penetrates through the heavily doped region 224 and the well region 222 and removes a portion of the insulating pillar 108. Thus, the contact hole 232 exposes the heavily doped region 224, the well region 222 and the top surface 308a of the insulating pillar 308.

In some embodiments, the top surface 308a of the insulating pillar 308 is lower than the top surface 21a of the gate structure 21 (for example, the top surface 216a of the top gate electrode 216). In some embodiments, the top surface 308a of the insulating pillar 308 is lower than the top surface 224a of the heavily doped region 224. In addition, in some embodiments, the top surface 308a of the insulating pillar 308 is lower than the top surface 222a of the well region 222. Therefore, as shown in FIG. 14, the heavily doped region 224 is in contact with the gate structure 21, but is not in contact with the insulating pillar 308. For example, the heavily doped region 224 is in contact with the top gate electrode 216 and separated from the insulating pillar 308.

Next, referring to FIG. 15, another heavily doped region 234 can be formed in the well region 222, in accordance with some embodiments of the present disclosure. The heavily doped region 234 and the well region 222 have the same conductivity type, for example, the second conductivity type. In this exemplified embodiment, the heavily doped region 234 is p-type. In some embodiments, the doping concentration of the heavily doped region (such as a p+ region) 234 is greater than the doping concentration of the well region 222. In some embodiments, the doping concentration of the heavily doped region 234 is in the range of about 1E18 atoms/cm$^3$ to about 1E21 atoms/cm$^3$.

In some embodiments, an ion implantation process can be performed through a portion of the sidewalls of the contact hole 232 to form a heavily doped region 234 in the well region 222. The heavily doped region 234, for example, extends downward from an interface between the well region 222 and the heavily doped region 224. In some embodiments, the heavily doped region 234 surrounds the contact hole 232. In addition, the heavily doped region 234 is not in contact with the insulating pillars 308, in accordance with some embodiments of the present disclosure. Specifically, in this exemplified embodiment, the bottom surface 234b of the heavily doped region 234 is separated from the top surface 308a of the insulating pillar 308 by a distance. According to the semiconductor device of some embodiments, formation of the heavily doped region 234 provides a good ohmic contact between the well region 222 and the contact plug 236 that is formed subsequently.

Next, referring to FIG. 16, a contact plug 236 is formed in the contact hole 232 in accordance with some embodiments of the present disclosure. The contact plug 236 is formed on the insulating pillar 308 and in direct contact with the insulating pillar 308. In this exemplified embodiment, the top surface 308a of the insulating pillar 308 is completely covered by the contact plug 236. In addition, the contact plug 236 is electrically connected to the well region 222, in accordance with some embodiments of the present disclosure. In this exemplified embodiment, a good electrical connection between the contact plug 236 and the well region 222 can be achieved by the heavily doped region 234. In addition, the contact plug 236 and the gate structure 21 are separated from each other, in accordance with some embodiments of the present disclosure. For example, the contact plug 236 and the top gate electrode 216 are laterally separated from each other (such as in the second direction D2) by a distance.

In some embodiments, the contact plug 236 includes a contact barrier layer 2361 and a contact conductive layer 2363. The contact barrier layer 2361 is formed on the sidewall and bottom of the contact hole 232, and can be referred to as a barrier liner. The contact conductive layer 2363 fills the remaining space in the contact hole 232. In this exemplified embodiment, as shown in FIG. 16, the contact barrier layer 2361 covers the top surface 231a of the interlayer dielectric layer 231. In addition, the top surface 2363a of the contact conductive layer 2363 (which can be referred to as the top surface 236a of the contact plug 236) can be level with the top surface 231a of the interlayer dielectric layer 231.

In some exemplified embodiments, a barrier material (not shown) can be formed on the interlayer dielectric layer 231 by a deposition process, and the barrier material is conformably deposited in the contact holes 232. A conductive material (not shown) is deposited over the barrier material, and the conductive material fills the remaining space in the contact hole 232. Next, the excess portions of the conductive material and the barrier material over the interlayer dielectric layer 231 are removed (such as by etching) to form a contact barrier layer 2361 and a contact conductive layer 2363 in the contact holes 232.

In some embodiments, the material of the contact barrier layer 2361 includes titanium (Ti), titanium nitride (TiN), tantalum (Ta), tantalum nitride (TaN), cobalt (Co), cobalt tungsten phosphorus compound (CoWP), ruthenium (Ru), aluminum oxide ($Al_2O_3$), magnesium oxide (MgO), aluminum nitride (AlN), tantalum pentoxide ($Ta_2O_5$), silicon dioxide ($SiO_2$), hafnium dioxide ($HfO_2$), zirconium dioxide ($ZrO_2$), magnesium fluoride ($MgF_2$), calcium fluoride ($CaF_2$), another suitable barrier material, or a combination of the foregoing materials. In some embodiments, the contact barrier layer 2361 can be formed by a chemical vapor deposition (CVD) process, an atomic layer deposition (ALD) process, a physical vapor deposition (PVD) process, another suitable process, or a combination of the foregoing processes.

In some embodiments, the contact conductive layer 2363 is a single-layer structure or a multilayer structure that includes one or more conductive materials. In some embodiments, the contact conductive layer 2363 includes tungsten (W), aluminum (Al), copper (Cu), titanium (Ti), tantalum (Ta), titanium nitride (TiN), tantalum nitride (TaN), nickel silicide (NiSi), cobalt silicide (CoSi), tantalum carbide (TaC), tantalum silicon nitride (TaSiN), tantalum carbide nitride (TaCN), titanium aluminide (TiAl), titanium aluminide nitride (TiAlN), another suitable metal, or a combination of the foregoing materials. In addition, the contact conductive layer 2363 can be formed by using a chemical vapor deposition (CVD) process, an atomic layer deposition (ALD) process, a physical vapor deposition (PVD) process, another suitable process, or a combination of the foregoing processes, in accordance with some embodiments of the present disclosure.

Next, after the contact plug 236 is formed, a metal layer 238 is formed over the interlayer dielectric layer 231 and the contact plugs 236, in accordance with some embodiments of the present disclosure. The metal layer 238 covers the contact plug 236 and is in physical and electrical contact with the contact plug 236. Therefore, the metal layer 238 is electrically connected to the heavily doped region 224, the heavily doped region 234 and the well region 222 through the contact plug 236.

The metal layer 238 can be used as the top metal of the semiconductor device for electrically connecting to the heavily doped region 224 that is the source region of the semiconductor device, in accordance with some embodiments of the present disclosure. Thus, the metal layer 238 can also be referred to as a source metal layer. In addition, the bottom gate electrode 212 of the semiconductor device can be further electrically connected to the metal layer 238 via other interconnects (not shown), in accordance with some embodiments of the present disclosure.

In some embodiments, the metal layer 238 includes copper, silver, gold, aluminum, tungsten, another suitable metal material, or a combination of the foregoing materials. In some embodiments, the metal layer 238 and the contact plug 236 are formed of the same material(s). In some other embodiments, the material of the metal layer 238 is different from the material of the contact plug 236. The metal layer 238 can be formed on the contact plugs 236 by a deposition process, in accordance with some embodiments of the present disclosure. The deposition process may include a physical vapor deposition (PVD) process, a chemical vapor deposition (CVD) process, another suitable process, or a combination of the foregoing processes. In some embodiments, after the metal layer 238 is formed, the fabrication of a semiconductor device is completed.

According to the aforementioned descriptions, a semiconductor device and a method for forming the same are provided, in accordance with some embodiments of the present disclosure. The semiconductor device that includes a reduced surface electrical field (RESURF) structure of the embodiments can increase the breakdown voltage of the semiconductor device. Alternatively, the doping concentration of the doping drift layer (i.e. the doping epitaxial layer) can be increased to reduce the on-resistance while maintaining the breakdown voltage of the semiconductor device, in accordance with some embodiments of the present disclosure. In addition, in some embodiments, the RESURF structure (such as including the insulating pillar 308, the first doping region(s) 11, or a combination of the first doping region(s) 11 and the second doping region(s) 12) is positioned under the bottom of the contact plug 236 that is connected to the source region (i.e., the heavily doped region 224). Therefore, the RESURF structure of the semiconductor device does not occupy extra space of the epitaxial layer 102 laterally (such as in the second direction D2), in accordance with some embodiments of the present disclosure. There is no need to increase a lateral dimension of the semiconductor device when the RESURF structure of the embodiment is formed in the epitaxial layer 102 of the semiconductor device.

In addition, compared to the fabrication of conventional semiconductor devices with super junction structures that require complicated manufacturing procedures, such as several epitaxial processes, lithography processes and implantation processes, the method for forming a semiconductor device of the embodiments is relatively simple and does not require high manufacturing cost. For example, there is no need to perform expensive epitaxial steps repeatedly in the method of the embodiments. In addition, the method for forming the semiconductor device of the embodiments is not prone to the epitaxial defects that easily occur in a conventional semiconductor device. In addition, more doping regions can be formed in the epitaxial layer 102 through the trench 107 that may extend into inner portions of the epitaxial layer 102, in accordance with the embodiments of the present disclosure. Accordingly, the depth of the RESURF region of the embodiments can be increased, thereby increasing the breakdown voltage of the semiconductor device, that is, improving the withstand voltage capability of the semiconductor device. In addition, according to the method for forming a semiconductor device of the embodiments, the doping regions of the RESURF structure in an accurate overlay arrangement can be achieved by using simple procedures (such as formation of a trench, extension of the trench and formation of the doping regions through the trench by ion implantation). Thus, the semiconductor device of the embodiments has improved electrical characteristics and stable operation performance.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a substrate having a first conductivity type;
an epitaxial layer on the substrate, wherein the epitaxial layer has the first conductivity type;
a well region over the substrate, wherein the well region is formed in the epitaxial layer and has a second conductivity type;
an insulating pillar extending into the epitaxial layer;
at least one first doping region in the epitaxial layer, wherein the at least one first doping region has the second conductivity type and surrounds sidewalls of the insulating pillar, and the insulating pillar penetrates the at least one first doping region by extending from a top portion of the at least one first doping region to a bottom portion of the at least one first doping region, and the at least one first doping region is electrically connected to the well region;
at least one second doping region having the second conductivity type, wherein the at least one second doping region is positioned under the at least one first doping region and closer to the substrate than the at least one first doping region; and
a gate structure disposed at one lateral side of the insulating pillar, wherein the gate structure extends into the epitaxial layer and is separated from the insulating pillar;
wherein the at least one second doping region is disposed under the insulating pillar, and the at least one second doping region and the insulating pillar are separated from each other by a distance.

2. The semiconductor device as claimed in claim 1, comprising a plurality of first doping regions, wherein the insulating pillar sequentially penetrates the plurality of first doping regions.

3. The semiconductor device as claimed in claim 2, wherein the plurality of first doping regions surrounds the sidewalls of the insulating pillar and are in contact with the sidewalls of the insulating pillar.

4. The semiconductor device as claimed in claim 2, wherein the plurality of first doping regions is in contact with each other.

5. The semiconductor device as claimed in claim 1, wherein the at least one first doping region is coupled to an electric ground.

6. The semiconductor device as claimed in claim 1, wherein the at least one second doping region has a floating potential.

7. The semiconductor device as claimed in claim 1, wherein a bottom surface of the insulating pillar protrudes from the bottom portion of the at least one first doping region.

8. The semiconductor device as claimed in claim 1, wherein a top surface of the insulating pillar is lower than a top surface of the gate structure.

9. The semiconductor device as claimed in claim 1, wherein a topmost surface of the at least one second doping region is separated from a bottom surface of the insulating pillar by a first distance, and the topmost surface of the at least one second doping region is separated from a bottom surface of the first doping region that is adjacent to the second doping region by a second distance, wherein the second distance is greater than the first distance.

10. The semiconductor device as claimed in claim 1, wherein a bottommost portion of the at least one second doping region is closer to the substrate than a bottommost portion of the gate structure.

11. The semiconductor device as claimed in claim 1, comprising a plurality of second doping regions, wherein the insulating pillar is not in contact with the plurality of second doping regions, and the plurality of second doping regions are arranged in an extending direction of the insulating pillar.

12. The semiconductor device as claimed in claim 1, wherein the well region extends from a top surface of the epitaxial layer, and the well region is in contact with the sidewalls of the insulating pillar and the gate structure.

13. The semiconductor device as claimed in claim 12, wherein a top surface of the gate structure is lower than a top surface of the well region.

14. The semiconductor device as claimed in claim 12, further comprising:
a heavily doped region formed in the well region and extending from the top surface of the epitaxial layer into the epitaxial layer,
wherein the heavily doped region has the first conductivity type, and the heavily doped region is in contact with the gate structure but not in contact with the insulating pillar.

15. The semiconductor device as claimed in claim 1, further comprising:
a contact plug on the insulating pillar and electrically connected to the well region,
wherein the contact plug is in direct contact with the insulating pillar but separated from the gate structure.

16. A method for forming a semiconductor device, comprising:
providing a substrate having a first conductivity type;
forming an epitaxial layer on the substrate, wherein the epitaxial layer has the first conductivity type;
providing a mask over the epitaxial layer, wherein the mask has a hole to expose a top surface of the epitaxial layer;
performing a first ion implantation process over the mask to form at least one first doping region in the epitaxial layer through the hole of the mask, wherein the at least one first doping region has the second conductivity type;
removing a portion of the epitaxial layer and a portion of the at least one first doping region to form a trench in the epitaxial layer, wherein a bottom surface of the trench exposes the epitaxial layer;
performing a second ion implantation process over the mask to form at least one second doping region in the epitaxial layer through the hole of the mask;

filling an insulating material into the trench, wherein the at least one second doping region is disposed under the trench, and the at least one second doping region and the trench are separated from each other by a distance; and forming a gate structure at one lateral side of the trench, wherein the gate structure extends into the epitaxial layer and is separated from the insulating material in the trench.

17. The method for forming the semiconductor device as claimed in claim 16, wherein forming the gate structure comprises:

forming a recess in the epitaxial layer, wherein the recess is positioned at the lateral side of the trench;

forming a liner layer in the recess; and forming a gate electrode on the liner layer in the recess.

18. The method for forming the semiconductor device as claimed in claim 16 wherein after the gate structure is formed, the method further comprises:

forming a well region in the epitaxial layer, wherein the well region has the second conductivity type, and the well region extends downward from the top surface of the epitaxial layer into the epitaxial layer; and implanting the top surface of the epitaxial layer to form a heavily doped region in the well region, wherein the heavily doped region has the first conductivity type.

19. The method for forming the semiconductor device as claimed in claim 18, further comprising:

forming an interlayer dielectric (ILD) layer on the heavily doped region; and removing a portion of the interlayer dielectric (ILD) layer, a portion of the heavily doped region and a portion of the insulating material to form a contact hole, wherein remaining portions of the insulating material form an insulating pillar;

wherein the heavily doped region is in contact with the gate structure, but not in contact with the insulating pillar.

20. The method for forming the semiconductor device as claimed in claim 19, further comprising:

forming a contact plug in the contact hole, wherein the contact plug is formed on the insulating pillar and in direct contact with the insulating pillar, and the contact plug is electrically connected to the well region.

* * * * *